United States Patent
Kyono et al.

(10) Patent No.: US 8,513,684 B2
(45) Date of Patent: Aug. 20, 2013

(54) NITRIDE SEMICONDUCTOR LIGHT EMITTING DEVICE

(75) Inventors: Takashi Kyono, Itami (JP); Yohei Enya, Itami (JP); Yusuke Yoshizumi, Itami (JP); Katsushi Akita, Itami (JP); Masaki Ueno, Itami (JP); Takamichi Sumitomo, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 46 days.

(21) Appl. No.: 13/294,034

(22) Filed: Nov. 10, 2011

(65) Prior Publication Data

US 2012/0119240 A1    May 17, 2012

Related U.S. Application Data

(63) Continuation of application No. PCT/JP2010/055589, filed on Mar. 29, 2010.

(30) Foreign Application Priority Data

May 11, 2009    (JP) .................................. 2009-114887

(51) Int. Cl.
    *H01L 33/00*    (2010.01)
(52) U.S. Cl.
    USPC ............................... 257/94; 257/79; 257/103
(58) Field of Classification Search
    USPC ............................................ 257/94, 79, 103
    See application file for complete search history.

(56) References Cited

U.S. PATENT DOCUMENTS 6,590,919 B1    7/2003    Ueta

FOREIGN PATENT DOCUMENTS

| JP | 11-261160 | 9/1999 |
|----|-----------|--------|
| JP | 2001-024285 | 1/2001 |
| JP | 2001-237455 | 8/2001 |
| JP | 2002-324946 | 11/2002 |
| JP | 2002-335052 A | 11/2002 |
| JP | 2008-060375 | 3/2008 |
| JP | 2008-277539 | 11/2008 |
| JP | 2009-094360 A | 4/2009 |

OTHER PUBLICATIONS

Notice of Allowance in Japanese Patent Application No. 2009-114887 dated Jun. 11, 2013.

*Primary Examiner* — Douglas Menz
(74) *Attorney, Agent, or Firm* — Venable LLP; Michael A. Sartori; Tamatane J. Aga (57) ABSTRACT

A nitride semiconductor light emitting device is provided. A core semiconductor region, a first cladding region, and a second cladding region are mounted on a nonpolar primary surface of a support substrate of GaN which is not the polar plane. The core semiconductor region includes an active layer and a carrier block layer. The first cladding region includes an n-type AlGaN cladding layer and an n-type InAlGaN cladding layer. The n-type InAlGaN cladding layer is provided between the n-type AlGaN cladding layer and the active layer. A misfit dislocation density at an interface is larger than that at an interface. The AlGaN cladding layer is lattice-relaxed with respect to the GaN support substrate and the InAlGaN cladding layer is lattice-relaxed with respect to the AlGaN cladding layer.

20 Claims, 5 Drawing Sheets

NITRIDE SEMICONDUCTOR LIGHT EMITTING DEVICE

CROSS REFERENCE TO RELATED APPLICATIONS

This is a continuation of PCT application No. PCT/JP2010/055589 filed on Mar. 29, 2010, claiming the benefit of priorities from Japanese Patent application No 2009-114887 filed on May 11, 2009.

TECHNICAL FIELD

The present invention relates to a nitride semiconductor light emitting device.

BACKGROUND ART

Patent Literature 1 describes an ultraviolet light emitting device. The ultraviolet light emitting device emits light with high efficiency at room temperature in the ultraviolet short-wavelength region of not more than the wavelength of 360 nm. This ultraviolet light emitting device has a quantum well structure, provided on a SiC substrate, including $In_{0.37}Al_{0.02}Ga_{0.61}N$ layers and $In_{0.16}Al_{0.06}Ga_{0.78}N$ layers making alternate junctions. This quantum well structure is formed directly on an $Al_{0.40}Ga_{0.60}N$ layer.

CITATION LIST

Patent Literature

Patent Literature 1: Japanese Patent Application Laid-open No. 2001-237455

SUMMARY OF INVENTION

Technical Problem

In Patent Literature 1, an InAlGaN layer serves as a buffer layer and has the same composition as the bather layers. This InAlGaN buffer layer is grown thick so as to provide the barrier layer with an extension. Furthermore, the InAlGaN layer has the same composition as the InAlGaN barrier layers formed between the well layers in the quantum well structure and in this point of view, the InAlGaN layer is different from cladding layers.

According to Inventors' knowledge, a slip plane (e.g., c-plane slip plane) becomes active on a semipolar gallium nitride (GaN) substrate and, therefore, an adjacent semiconductor layer with great strain undergoes lattice relaxation to release internal strain. For this reason, AlGaN can be grown in a higher Al composition on the semipolar GaN substrate than on a c-plane GaN substrate. Formed in this AlGaN are not cracks but misfit dislocations, thereby releasing the internal strain. When AlGaN in the high Al composition is applied to the cladding layers, a core semiconductor region between p-type and n-type cladding layers may be lattice-relaxed with respect to the cladding layers. When the difference between the lattice constant of the core semiconductor region and the lattice constant(s) of the cladding layers is large because of the high Al composition, misfit dislocations are formed at the interfaces between the cladding layers and the core semiconductor region.

The cladding layers are provided for optical confinement, and in the cladding layers, the amplitude of light is small. When misfit dislocations due to the difference between the lattice constant of the core semiconductor region and the lattice constant(s) of the cladding layers are formed at the interfaces therebetween, the misfit dislocations cause an optical loss due to scattering of light.

It is an object of the present invention to provide a nitride semiconductor light emitting device capable of improving the optical confinement performance and reducing the optical loss due to dislocations in the light emitting device formed on a plane which is not polar.

Solution to Problem

A nitride semiconductor light emitting device according to one aspect of the present invention comprises: (a) a support substrate comprising a hexagonal gallium nitride semiconductor; (b) a first cladding region comprising a first conductivity type gallium nitride based semiconductor; (c) a second cladding region comprising a second conductivity type gallium nitride-based semiconductor; and (d) a core semiconductor region comprising an active layer and a carrier block layer. The c-axis of the hexagonal gallium nitride semiconductor is directed along a direction different from a normal axis to the primary surface of the support substrate, and a plane defined by the c-axis of the hexagonal gallium nitride semiconductor and the normal axis to the support substrate extends along a predetermined direction; the core semiconductor region is provided between the first cladding region and the second cladding region; the core semiconductor region, the first cladding region, and the second cladding region are mounted on the primary surface of the support substrate; the first cladding region comprises an AlGaN cladding layer and an InAlGaN cladding layer; the InAlGaN cladding layer is provided between the AlGaN cladding layer and the active layer; and the InAlGaN cladding layer makes a junction with the core semiconductor region.

In this nitride semiconductor light emitting device, since the InAlGaN cladding layer is provided between the AlGaN cladding layer and the core semiconductor region, it becomes feasible to increase the Al composition and/or to increase the thickness of the AlGaN layer in order to enhance the optical confinement performance of the AlGaN layer. Furthermore, since quaternary InAlGaN is applied to the cladding layer, the cladding region having the AlGaN cladding layer and the InAlGaN cladding layer can provide both an excellent junction with the core semiconductor region and a lattice constant enabling to provide the refractive index necessary for the cladding layer.

In the nitride semiconductor light emitting device according to the present invention, the first cladding region includes an interface between the AlGaN cladding layer and the InAlGaN cladding layer, and a misfit dislocation density at the interface between the InAlGaN cladding layer and the AlGaN cladding layer is larger than a misfit dislocation density at an interface between the core semiconductor region and the first cladding region.

In this nitride semiconductor light emitting device, the misfit dislocation density at the interface between the InAlGaN cladding layer and the AlGaN cladding layer is larger than the misfit dislocation density at the interface between the core semiconductor region and the first cladding region. This allows an increase in the Al composition of the AlGaN layer and/or an increase in the thickness of the InAlGaN layer enough to induce lattice relaxation of the InAlGaN cladding layer by introduction of the misfit dislocations, thereby improving the optical confinement performance as a whole of the first cladding layer. In this structure, the interface between the core semiconductor region and the first cladding region is isolated from the interface of the larger misfit dislocation density by the InAlGaN layer.

In the nitride semiconductor light emitting device according to the present invention, preferably, in the first cladding region, the misfit dislocation density at the interface between the InAlGaN cladding layer and the AlGaN cladding layer is not less than $1\times10^4$ cm$^{-1}$. This nitride semiconductor light emitting device enables lattice relaxation to occur in one of the semiconductor layers associated with the interface when dislocations in this dislocation density are introduced to the foregoing interface. The AlGaN cladding layer in the Al composition and thickness which are enough to cause lattice relaxation can improve the optical confinement performance.

In the nitride semiconductor light emitting device according to the present invention, it is preferable that the misfit dislocation density at the interface between the core semiconductor region and the first cladding region be less than $1\times10^4$ cm$^{-1}$. This nitride semiconductor light emitting device can reduce the optical loss due to scattering of light by misfit dislocations. The core semiconductor region having a lamination of relatively thin semiconductor layers is composed of semiconductor layers coherently grown.

In the nitride semiconductor light emitting device according to the present invention, preferably, in the first cladding region, an Al composition of the AlGaN cladding layer is not less than 0.05. The Al composition of the AlGaN cladding layer is preferably not more than 0.2.

When the Al composition is not less than 0.05, the AlGaN cladding layer can be relaxed with respect to the InAlGaN cladding layer. A too large Al composition raises possibilities of degradation of crystal quality of the AlGaN cladding layer and relaxation of the AlGaN cladding layer in a direction perpendicular to the c-axis off direction.

In the nitride semiconductor light emitting device according to the present invention, preferably, in the first cladding region, a thickness of the InAlGaN cladding layer is smaller than a thickness of the AlGaN cladding layer. This nitride semiconductor light emitting device can make use of the optical confinement performance of the AlGaN cladding layer, and it is also feasible to avoid reduction in throughput due to growth of thick InAlGaN.

In the nitride semiconductor light emitting device according to the present invention, preferably, in the first cladding region, a bandgap of the InAlGaN cladding layer is not more than a bandgap of the AlGaN cladding layer. This nitride semiconductor light emitting device enables the lattice-relaxed AlGaN cladding layer to provide a large bandgap which cannot be practically employed with the quaternary InAlGaN cladding layer.

In the nitride semiconductor light emitting device according to the present invention, preferably, in the first cladding region, the thickness of the InAlGaN cladding layer is not less than 0.05 µm. If the InAlGaN cladding layer is too thin in the nitride semiconductor light emitting device, the interface between the InAlGaN cladding layer and the AlGaN cladding layer cannot be located apart from the core semiconductor region and then an optical loss will occur at this interface. Furthermore, preferably, the thickness of the InAlGaN cladding layer is not more than 0.3 µm. In this nitride semiconductor light emitting device, too thick InAlGaN reduces contribution of the AlGaN cladding layer to the optical confinement performance.

In the nitride semiconductor light emitting device according to the present invention, preferably, in the first cladding region, the bandgap of the InAlGaN cladding layer is not less than the bandgap of the AlGaN cladding layer.

This nitride semiconductor light emitting device can achieve desired optical confinement performance as a whole of the cladding region even if thick InAlGaN is grown thereon such that the interface between the InAlGaN cladding layer and the AlGaN cladding layer is located apart from the core semiconductor region.

In the nitride semiconductor light emitting device according to the present invention, preferably, in the first cladding region, the thickness of the InAlGaN cladding layer is not less than 0.05 µm. If the InAlGaN layer is too thin in this nitride semiconductor light emitting device, the interface between the InAlGaN cladding layer and the AlGaN cladding layer cannot be located apart from the core semiconductor region and then an optical loss will occur at this interface. In the nitride semiconductor light emitting device according to the present invention, preferably, the thickness of the InAlGaN cladding layer is not more than 1.0 µm. In this nitride semiconductor light emitting device, the maximum thickness of 1.0 µm is practical even in the case of InAlGaN not permitting a large growth rate.

In the nitride semiconductor light emitting device according to the present invention, preferably, the core semiconductor region comprises a first optical guide layer; the first optical guide layer makes a junction with the InAlGaN cladding layer of the first cladding region; a lattice constant inherent to InAlGaN in the InAlGaN cladding layer of the first cladding region is not more than a lattice constant inherent to a gallium nitride based semiconductor of the first optical guide layer of the core semiconductor region; the lattice constant of the InAlGaN cladding layer of the first cladding region is larger than a lattice constant of the AlGaN cladding layer of the first cladding region.

In this nitride semiconductor light emitting device, the lattice constant of the InAlGaN cladding layer is larger than the lattice constant of the AlGaN cladding layer and is not more than the lattice constant inherent to the first optical guide layer. When dislocations are introduced to the interface between the AlGaN cladding layer and the InAlGaN cladding layer, it is feasible to avoid generation of an optical loss from dislocations at the junction between the first optical guide layer and the InAlGaN cladding layer.

In the nitride semiconductor light emitting device according to the present invention, preferably, the InAlGaN cladding layer is lattice-matched with the first optical guide layer with respect to a direction of projection of the c-axis onto the primary surface. In this nitride semiconductor light emitting device, the first optical guide layer is coherently grown on the InAlGaN cladding layer. The core semiconductor region is coherently grown on the InAlGaN cladding layer.

In the nitride semiconductor light emitting device according to the present invention, preferably, the first cladding region has n-type conductivity; and a misfit dislocation density at an interface between the support substrate and the AlGaN cladding layer of the first cladding region is larger than the misfit dislocation density at the interface between the core semiconductor region and the first cladding region.

This nitride semiconductor light emitting device can improve the optical confinement performance in the n-side semiconductor region. The AlGaN cladding layer of the first cladding region is lattice-relaxed on the support substrate. Hence, the optical confinement performance of the first cladding region can be improved by increase in the Al composition of the AlGaN cladding layer and/or increase in the thickness of the AlGaN cladding layer.

In the nitride semiconductor light emitting device according to the present invention, preferably, the misfit dislocation density at the interface between and support substrate and the AlGaN cladding layer of the first cladding region is not less than $1 \times 10^4$ cm$^{-1}$. In this nitride semiconductor light emitting device, the AlGaN cladding corresponding to this dislocation density can achieve excellent optical confinement.

In the nitride semiconductor light emitting device according to the present invention, the following configuration can be adopted: the first cladding region has p-type conductivity; the nitride semiconductor light emitting device further comprises a p-type contact layer provided on the first cladding region; the core semiconductor region comprises a second optical guide layer and an electron block layer; the second optical guide layer is provided between the electron block layer and the first cladding region; the electron block layer is provided between the second optical guide layer and the active layer.

This nitride semiconductor light emitting device can improve the optical confinement performance in the p-side semiconductor region. The p-type contact layer is provided on the lattice-relaxed AlGaN cladding layer and the lattice relaxation of the AlGaN cladding layer does not affect the p-type contact layer.

In the nitride semiconductor light emitting device according to the present invention, preferably, the first cladding region has n-type conductivity; the second cladding region has p-type conductivity; the second cladding region comprises an AlGaN cladding layer and an InAlGaN cladding layer; the InAlGaN cladding layer of the second cladding region is provided between the active layer and the AlGaN cladding layer of the second cladding region; the InAlGaN cladding layer of the second cladding region makes a junction with the core semiconductor region; a lattice constant of the InAlGaN cladding layer of the second cladding region is larger than a lattice constant of the AlGaN cladding layer of the second cladding region.

This nitride semiconductor light emitting device can improve the optical confinement performance in the p-side semiconductor region and in the n-side semiconductor region.

In the nitride semiconductor light emitting device according to the present invention, preferably, a misfit dislocation density at an interface between the AlGaN cladding layer and the InAlGaN cladding layer of the second cladding region is larger than a misfit dislocation density at an interface between the core semiconductor region and the second cladding region.

In this nitride semiconductor light emitting device, the p-type AlGaN layer and the n-type InAlGaN layer in the p-side semiconductor region and in the n-side semiconductor region, respectively, are lattice-relaxed.

In the nitride semiconductor light emitting device according to the present invention, the misfit dislocation density at the interface between the AlGaN cladding layer and the InAlGaN cladding layer of the second cladding region can be not less than $1 \times 10^4$ cm$^{-1}$.

This nitride semiconductor light emitting device enables lattice relaxation to occur in one of the semiconductor layers associated with the interface when dislocations in this dislocation density are introduced to the foregoing interface. This lattice relaxation can achieve excellent optical confinement by the AlGaN cladding layer.

In the nitride semiconductor light emitting device according to the present invention, preferably, an angle between the c-axis of the hexagonal gallium nitride semiconductor and the normal axis to the support substrate is not less than 10 degrees. Furthermore, the angle is preferably not more than 170 degrees. This nitride semiconductor light emitting device can achieve excellent optical confinement performance by making use of generation of a slip plane in a polarity which is not polar (polarity of semipolar nature and polarity of nonpolar nature).

In the nitride semiconductor light emitting device according to the present invention, preferably, the angle is in the range of not less than 10 degrees and not more than 80 degrees or in the range of not less than 100 degrees and not more than 170 degrees. This nitride semiconductor light emitting device can achieve excellent optical confinement performance by making use of generation of a slip plane in semipolar nature.

In the nitride semiconductor light emitting device according to the present invention, preferably, the angle is in the range of not less than 63 degrees and not more than 80 degrees or in the range of not less than 100 degrees and not more than 117 degrees.

In this nitride semiconductor light emitting device, it is easy to generate dislocations by introduction of a slip plane, device design flexibility is made high in this angular range. A semipolar plane in this angular range tends to provide an excellent In incorporation.

The above object and other objects, features, and advantages of the present invention will more readily become apparent in view of the following detailed description of the preferred embodiments of the present invention proceeding with reference to the accompanying drawings.

Advantageous Effects of Invention

As described above, the object of the present invention is to provide the nitride semiconductor light emitting device capable of improving the optical confinement performance and reducing the optical loss due to dislocations in the light emitting device formed on the nonpolar plane.

DESCRIPTION OF EMBODIMENTS

The expertise of the present invention can be readily understood in view of the following detailed description with reference to the accompanying drawings presented by way of illustration. The following will describe embodiments of the nitride semiconductor light emitting device and epitaxial substrate of the present invention, with reference to the accompanying drawings. The same portions will be denoted by the same reference signs as much as possible.

Figure 1:
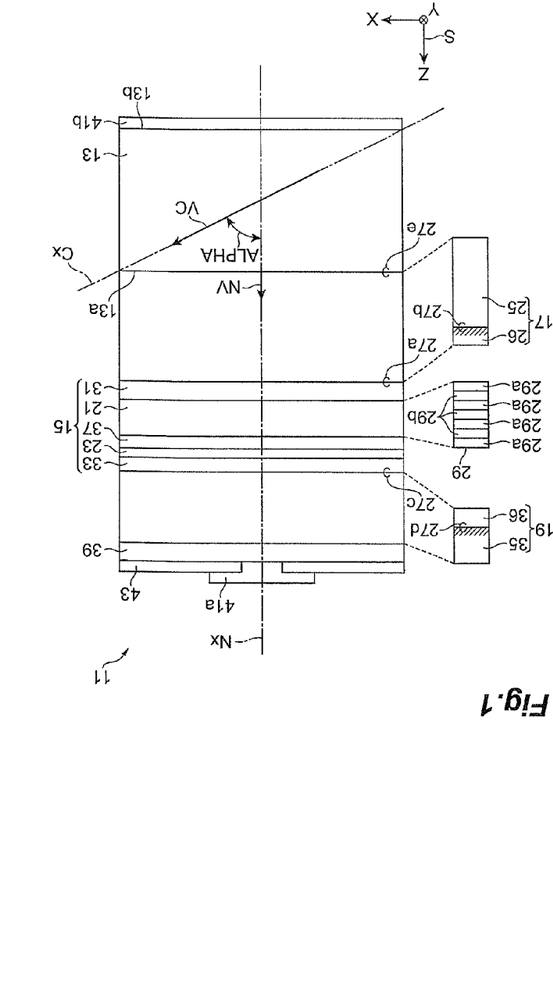
FIG. 1 is a drawing schematically showing a nitride semiconductor light emitting device according to an embodiment of the present invention.
Figure 2:
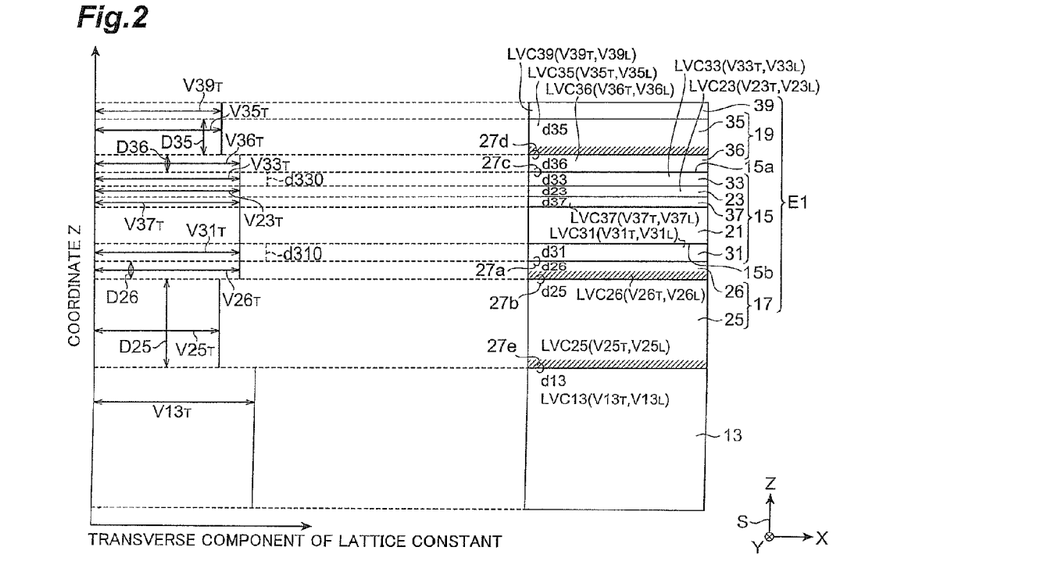
FIG. 2 is a drawing showing a relationship between semiconductor layers and lattice constants thereof, and the semiconductor layers constitutes an epitaxial substrate E1 for the nitride semiconductor light emitting device shown in FIG. 1.

FIG. 1 is a drawing schematically showing the nitride semiconductor light emitting device according to an embodiment of the present invention. FIG. 2 is a drawing showing the relationship between semiconductor layers, which form an epitaxial substrate E1 of the nitride semiconductor light emitting device shown in FIG. 1, and lattice constants thereof.

The nitride semiconductor light emitting device 11 has a support substrate 13, a core semiconductor region 15, a first cladding region 17, and a second cladding region 19. With reference to FIG. 1, there are an orthogonal coordinate system S, a c-axis vector VC, and a normal vector NV shown. The support substrate 13 is comprised of a hexagonal gallium nitride (GaN) semiconductor. The c-axis (indicated by a vector VC) Cx of this hexagonal GaN semiconductor is inclined toward a predetermined direction (e.g., the X-axis direction) with respect to a normal axis Nx to a primary surface 13a of the support substrate 13. The predetermined direction can be the a-axis, the m-axis, or the like of the hexagonal GaN semiconductor. The primary surface 13a can have nonpolar (semipolar or nonpolar) nature and is parallel to a plane defined by the X-axis and Y-axis. The c-axis Cx of the hexagonal GaN semiconductor is directed along a direction different from the normal axis Nx to the primary surface 13a of the support substrate 13. A plane defined by the normal axis Nx and the c-axis Cx of the support substrate 13 extends along the predetermined direction. The first cladding region 17 comprises a first conductivity type (e.g., n-type) GaN-based semiconductor. The second cladding region 19 comprises a second conductivity type (e.g., p-type) GaN-based semiconductor. The core semiconductor region 15 includes an active layer 21 and a carrier block layer 23. The core semiconductor region 15 is provided between the first cladding region 17 and the second cladding region 19. The core semiconductor region 15, the first cladding region 17, and the second cladding region 19 are mounted on the primary surface 13a of the support substrate 13.

In FIG. 1 both of the first cladding region 17 and the second cladding region 19 have a cladding structure which have two layers, but either one of the first cladding region 17 and the second cladding region 19 can have the cladding structure mentioned above.

In an embodiment, the first cladding region 17 includes an n-type AlGaN cladding layer 25 and an n-type InAlGaN cladding layer 26. The n-type InAlGaN cladding layer 26 is provided between the n-type AlGaN cladding layer 25 and the active layer 21. The n-type InAlGaN cladding layer 26 makes a junction 27a with the core semiconductor region 15.

Since this nitride semiconductor light emitting device 11 has the InAlGaN cladding layer 26 provided between the AlGaN cladding layer 25 and the core semiconductor region 15, it becomes feasible to increase the Al composition and/or to increase the thickness of the AlGaN layer 25 in order to enhance the optical confinement performance of the AlGaN layer 25. In addition, since quaternary InAlGaN is applied to the cladding layer, the cladding region 17 that has the AlGaN cladding layer 25 and the InAlGaN cladding layer 26 can provide both the refractive index necessary for the cladding and the lattice constant to make the excellent junction 27a with the core semiconductor region 15.

The first cladding region 17 includes an interface 27b between the AlGaN cladding layer 25 and the InAlGaN cladding layer 26. The misfit dislocation density at the interface 27b between the InAlGaN cladding layer 26 and the AlGaN cladding layer 25 is larger than that at the interface 27a between the core semiconductor region 15 and the first cladding region 17. This is based on the following: the more the InAlGaN cladding layer 26 is lattice-relaxed by introduction of the misfit dislocation density, the more the increase in the Al composition and/or the thickness of the AlGaN layer 25 can be made, thereby permitting improvement in the optical confinement performance as a whole of the first cladding region 17. In this structure, the interface 27a between the core semiconductor region 15 and the first cladding region 17 is isolated by the InAlGaN layer from the interface 27b that has the larger misfit dislocation density.

In the first cladding region 17, the Al composition of the AlGaN cladding layer 25 is preferably not less than 0.05. When the Al composition is not less than 0.05, the AlGaN cladding layer 25 in a practical thickness can be relaxed on the GaN support substrate. At this time, the InAlGaN cladding layer 26 can be relaxed on the AlGaN cladding layer 25. The Al composition of the AlGaN cladding layer 25 is preferably not more than 0.2. A too large Al composition will raise possibilities of relaxation of the AlGaN cladding layer 25 in a direction perpendicular to the c-axis off direction and deterioration of crystal quality of the AlGaN cladding layer 25.

In an embodiment, the second cladding region 19 includes a p-type AlGaN cladding layer 35 and a p-type InAlGaN cladding layer 36. The p-type InAlGaN cladding layer 36 is provided between the p-type AlGaN cladding layer 35 and the active layer 21. The p-type InAlGaN cladding layer 35 makes a junction 27c with the core semiconductor region 15.

Since this nitride semiconductor light emitting device 11 is provided with the InAlGaN cladding layer 36 between the AlGaN cladding layer 35 and the core semiconductor region 15, it becomes feasible to increase the Al composition and/or to increase the thickness of the AlGaN layer 35 in order to enhance the optical confinement performance of the AlGaN layer 35. In addition, since quaternary InAlGaN is applied to the cladding layer 36, the second cladding region 19 that has the AlGaN cladding layer 35 and the InAlGaN cladding layer 36 can provide both the refractive index necessary for the cladding and the lattice constant to make the excellent junction 27c with the core semiconductor region 15.

The second cladding region 19 includes an interface 27d between the AlGaN cladding layer 35 and the InAlGaN cladding layer 36. The misfit dislocation density at the interface 27d between the InAlGaN cladding layer 36 and the AlGaN cladding layer 35 is larger than that at the interface 27c between the core semiconductor region 15 and the second cladding region 19. This is based on the following: the more the AlGaN cladding layer 35 is lattice-relaxed by introduction of the misfit dislocation density, the more the increase in the Al composition and/or the thickness of the AlGaN layer 35 can be made, thereby permitting improvement in the optical confinement performance as a whole of the second cladding region 19. In this structure, the interface 27c between the core semiconductor region 15 and the second cladding region 19 is isolated by the InAlGaN layer from the interface 27d that has the larger misfit dislocation density.

In the second cladding region 19, the Al composition of the AlGaN cladding layer 35 is preferably not less than 0.05. When the Al composition is not less than 0.05, the AlGaN cladding layer 35 can be relaxed on the GaN support substrate. At this time, the AlGaN cladding layer 35 can be relaxed on the InAlGaN cladding layer 36. The Al composition of the AlGaN cladding layer 35 is preferably not more than 0.2. A too large Al composition will raise possibilities of relaxation of the AlGaN cladding layer 35 in the direction perpendicular to the c-axis off direction and deterioration of crystal quality of the AlGaN cladding layer 35.

In the first cladding region 17, the misfit dislocation density at the interface 27b between the InAlGaN cladding layer 26 and the AlGaN cladding layer 25 is preferably not less than $1\times10^4$ cm$^{-1}$. When dislocations in this dislocation density are introduced to the interface 27b, one of the semiconductor layers associated with the interface 27b is lattice-relaxed. The lattice relaxation can provide the AlGaN cladding layer 25 suitable for optical confinement.

The misfit dislocation density at the interface 27a between the core semiconductor region 15 and the first cladding region 17 is preferably less than $1\times10^4$ cm$^{-1}$. This can reduce the optical loss due to scattering of light caused by misfit dislocations. The core semiconductor region 15 that has a lamination of relatively thin semiconductor layers is composed of coherently grown semiconductor layers 21, 23, 29, 31, 33, and 37.

Furthermore, in the second cladding region 19, the misfit dislocation density at the interface 27d between the InAlGaN cladding layer 36 and the AlGaN cladding layer 35 is preferably not less than $1\times10^4$ cm$^{-1}$. When dislocations in this dislocation density are introduced to the interface 27d, one of the semiconductor layers associated with the interface 27d is lattice-relaxed. The lattice relaxation can provide the AlGaN cladding layer 35 suitable for optical confinement.

The relation of the lattice constants in the c-axis direction will be described in more detail with reference to FIG. 2. This relation is also applicable similarly to the lattice constants in the a-axis and m-axis directions. A c-axis direction in AlGaN of the n-type AlGaN cladding layer 25 and a magnitude of lattice constant d25 in the c-axis direction are represented by a lattice vector LVC25. The lattice vector LVC25 has a longitudinal component $V25_L$ in the direction of the normal axis Nx and a transverse component $V25_T$ perpendicular to the longitudinal component. A c-axis direction in InAlGaN of the n-type InAlGaN cladding layer 26 and a magnitude of lattice constant d26 in the c-axis direction are represented by a lattice vector LVC26. The lattice vector LVC26 has a longitudinal component $V26_L$ in the direction of the normal axis Nx and a transverse component $V26_T$ perpendicular to the longitudinal component. The transverse component $V25_T$ is smaller than the transverse component $V26_T$.

A c-axis direction in a GaN-based semiconductor of the GaN-based semiconductor layer 31 and a magnitude of lattice constant d31 in the c-axis direction are represented by a lattice vector LVC31. The lattice vector LVC31 has a longitudinal component $V31_L$ in the direction of the normal axis Nx and a transverse component $V31_T$ perpendicular to the longitudinal component. The transverse component $V25_T$ is smaller than the transverse component $V31_T$.

A c-axis direction in AlGaN of the p-type AlGaN cladding layer 35 and a magnitude of lattice constant d35 in the c-axis direction are represented by a lattice vector LVC35. The lattice vector LVC35 has a longitudinal component $V35_L$ in the direction of the normal axis Nx and a transverse component $V35_T$ perpendicular to the longitudinal component. A c-axis direction in InAlGaN of the p-type InAlGaN cladding layer 36 and a magnitude of lattice constant d36 in the c-axis direction are represented by a lattice vector LVC36. The lattice vector LVC36 has a longitudinal component $V36_L$ in the direction of the normal axis Nx and a transverse component $V36_T$ perpendicular to the longitudinal component. The transverse component $V35_T$ is smaller than the transverse component $V36_T$.

A c-axis direction in a GaN-based semiconductor of the GaN-based semiconductor layer 33 and a magnitude of lattice constant d33 in the c-axis direction are represented by a lattice vector LVC33. The lattice vector LVC33 has a longitudinal component $V33_L$ in the direction of the normal axis Nx and a transverse component $V33_T$ perpendicular to the longitudinal component. The transverse component $V35_T$ is smaller than the transverse component $V33_T$.

A c-axis direction in the GaN-based semiconductor of the support substrate 13 and a magnitude of lattice constant d13 in the c-axis direction are represented by a lattice vector LVC13. The lattice vector LVC13 has a longitudinal component $V13_L$ in the direction of the normal axis Nx and a transverse component $V13_T$ perpendicular to the longitudinal component. The transverse component $V25_T$ is smaller than the transverse component $V13_T$.

The misfit dislocation density at an interface 27e between the AlGaN cladding layer 25 of the first cladding region 17 and the support substrate 13 is preferably larger than that at the interface 27a between the core semiconductor region 15 and the first cladding region 17. This allows reduction in the refractive index of the AlGaN cladding layer 25 and thus permits improvement in optical confinement performance in the core semiconductor region 15. Furthermore, the AlGaN cladding layer 25 of the first cladding region 17 is lattice-relaxed on the support substrate 13. For this reason, the optical confinement performance by the first cladding region 17 can be improved by increase in the Al composition of the AlGaN cladding layer 25 and/or increase in the thickness of the AlGaN cladding layer 25.

The misfit dislocation density at the interface 27e between the AlGaN cladding layer 26 of the first cladding region 17 and the support substrate 13 is preferably not less than $1\times10^4$ cm$^{-1}$. AlGaN satisfying this dislocation density can provide excellent optical confinement.

In the nitride-based light emitting device 11, the AlGaN cladding layer 25 of the n-type cladding region 17 is lattice-relaxed on the primary surface 13a, which is not polar, of the support substrate 13. The thickness D25 of the AlGaN cladding layer 25 is preferably over a critical thickness in the Al composition of the AlGaN cladding layer 25. The transverse component $V13_T$ of the lattice constant is larger than the transverse component $V25_T$ of the lattice constant of the n-type AlGaN cladding layer 25.

The InAlGaN cladding layer 25 of the n-type cladding region 17 is lattice-relaxed on a plane, which is not polar, of the AlGaN cladding layer 25. The thickness D26 of the InAlGaN cladding layer 26 is preferably over a critical thickness in the Al composition and In composition of the InAlGaN cladding layer 26. The transverse component $V25_T$ of the lattice constant is smaller than the transverse component $V26_T$ of the lattice constant of the n-type InAlGaN cladding layer 26. The GaN-based semiconductor layer 31, active layer 21, GaN-based semiconductor layer 37, electron block layer 23, GaN-based semiconductor layer 33, and InAlGaN cladding layer 36 are coherently grown on the InAlGaN cladding layer 26. Hence, as shown in FIG. 2, the transverse components of the lattice constants of the GaN-based semiconductor layer 31, active layer 21, GaN-based semiconductor layer 37, electron block layer 23, GaN-based semiconductor layer 33, and InAlGaN cladding layer 36 are equal to each other.

Since the interfaces 27b, 27e of the large dislocation density are located apart from the interface 27a between the core semiconductor region 15 and the cladding region 17, the optical loss from scattering due to dislocations is small.

In the nitride-based light emitting device 11, the AlGaN cladding layer 35 of the p-type cladding region 19 is lattice-relaxed on a primary surface, which is not polar, of the InAlGaN cladding layer 36. The thickness D35 of the AlGaN cladding layer 35 is preferably over a critical thickness in the Al composition of the AlGaN cladding layer 35. The transverse component $V35_T$ of the lattice constant is smaller than the transverse component $V36_T$ of the lattice constant of the InAlGaN cladding layer 36.

The InAlGaN cladding layer 36 of the p-type cladding region 19 is not lattice-relaxed on a plane of the core semiconductor region 15. The thickness D36 of the InAlGaN cladding layer 36 is preferably not more than a critical thickness in the Al composition and In composition of the InAlGaN cladding layer 36. The InAlGaN cladding layer 36 is coherently grown on the plane, which is not polar, of the core semiconductor region 15 coherently grown on the InAlGaN cladding layer 26. The transverse component $V36_T$ of the lattice constant is lattice-matched with the transverse component $V33_T$ of the lattice constant of the GaN-based semiconductor layer 33.

Since the interface 27d at the large dislocation density is located apart from the interface 27c between the core semiconductor region 15 and the cladding region 19, the optical loss from scattering due to dislocations is small.

As shown in FIGS. 1 and 2, the active layer 21 has a quantum well structure 29. The quantum well structure 29 includes barrier layers 29a and well layers 29b which are alternately arranged. The barrier layers 29a comprises, for example, InGaN, GaN, or the like and the well layers 29b comprises, for example, InGaN or the like. The well layers 29b incorporates strain according to the difference between the lattice constant of the well layers 29b and the lattice constant of the GaN-based semiconductor layer 31, and the barrier layers 29a incorporates strain according to the difference between the lattice constant of the barrier layers 29a and the lattice constant of the GaN-based semiconductor layer 31.

The first gallium nitride based semiconductor layer 31 can serve as an optical guide layer. The second gallium nitride based semiconductor layer 33 can serve as an optical guide layer. The third gallium nitride based semiconductor layer 37 can serve as an optical guide layer. The refractive index of the first gallium nitride based semiconductor layer 31 is larger than that of the first cladding region 17. The refractive index of the second and third gallium nitride based semiconductor layers 33, 37 is larger than that of the electron block layer 23 and larger than that of the p-type cladding layer 19. The first gallium nitride based semiconductor layer 31 includes first and second semiconductor layers 31a, 31b and the bandgap of the first semiconductor layer 31a is larger than that of the second semiconductor layer 31b. The third gallium nitride based semiconductor layer 37 includes first and second semiconductor layers 37a, 37b and the bandgap of the first semiconductor layer 37a is smaller than that of the second semiconductor layer 37b.

As shown in FIG. 1, the nitride semiconductor light emitting device 11 can include a p-type contact layer 39 provided on the p-type cladding layer 19. The p-type contact layer 39 can comprise GaN, AlGaN, or the like. A p-side electrode 41a is in contact with the p-type contact layer 39 through an aperture of insulating film 43.

The nitride semiconductor light emitting device 11 can include an n-side electrode 41b in contact with a back surface 13b of the support substrate 13. An angle ALPHA between the c-axis (VC) of the hexagonal gallium nitride semiconductor of the support substrate 13 and the normal axis Nx is preferably not less than 10 degrees. The foregoing angle is preferably not more than 170 degrees. In this range, excellent optical confinement performance can be achieved by making use of generation of a slip plane in a nature which is not polar (semipolar and nonpolar natures). The angle ALPHA is preferably in the range of not less than 10 degrees and not more than 80 degrees or in the range of not less than 100 degrees and not more than 170 degrees. In this angular range, excellent optical confinement performance can be achieved by making use of generation of a slip plane in semipolar nature. Furthermore, the angle ALPHA is preferably in the range of not less than 63 degrees and not more than 80 degrees or in the range of not less than 100 degrees and not more than 117 degrees. In this angular range, it is easy to generate dislocations by introduction of a slip plane and degrees of freedom are high for design of device. A semipolar plane in this angular range tends to be excellent in In incorporation.

As shown in FIG. 2, the gallium nitride based semiconductor layer 31 of the core semiconductor region 15 makes the junction 27a with the InAlGaN cladding layer 26 of the first cladding region 17. The lattice constant d26 of the InAlGaN cladding layer 26 is equal to the lattice constant inherent to InAlGaN in the InAlGaN cladding layer 26 when the InAlGaN cladding layer 26 is perfectly lattice-relaxed. The lattice constant d25 of the AlGaN cladding layer 25 is equal to the lattice constant inherent to AlGaN in the AlGaN cladding layer 25 when the AlGaN cladding layer 25 is perfectly lattice-relaxed. The lattice constant d26 is not more than the lattice constant d310 (peculiar to the gallium nitride based semiconductor of the gallium nitride based semiconductor layer 31) when the gallium nitride based semiconductor layer 31 is unstrained. The lattice constant d26 is preferably larger than the lattice constant d25.

When the relation of the lattice constants (d310≧d26>d25) is satisfied, dislocations are introduced to the interface between the AlGaN cladding layer 25 and the InAlGaN cladding layer 26, with increase in the difference between the lattice constant d26 and the lattice constant d25. At this time, the difference between the lattice constant d26 and the lattice constant d310 becomes smaller, so as to be able to avoid generation of optical loss due to dislocations at the junction 27a between the first optical guide layer and the InAlGaN cladding layer 26. The gallium nitride based semiconductor layer 31 is coherently grown on the InAlGaN cladding layer 26. The core semiconductor region 15 is coherently grown on the InAlGaN cladding layer 26. For example, the InAlGaN cladding layer 26 is preferably lattice-matched with the gallium nitride based semiconductor layer 31 with respect to a direction of projection of the c-axis onto the primary surface 13a. When the relation of the lattice constants (d330≧d36>d35) is satisfied, the same technical contribution as above is achieved.

Figure 3:
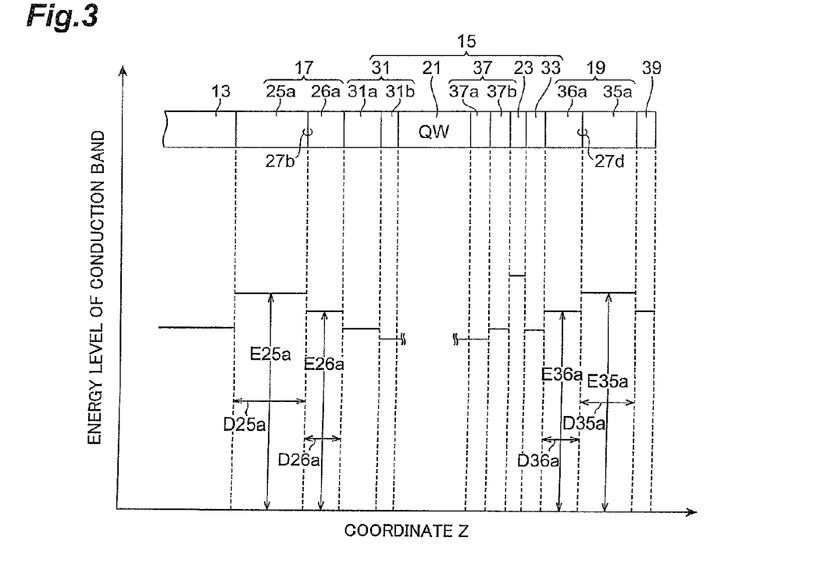
FIG. 3 is a drawing showing energy levels of conduction bands in cladding regions.

FIG. 3 is a drawing showing energy levels of conduction bands in the cladding regions. The nitride semiconductor light emitting device 11 can have at least either one of structure 1 and structure 2 below. Structure 1 and structure 2 will be described with reference to the light emitting device having the conduction band energy levels shown in FIG. 3.

Structure 1 will be described. With reference to FIG. 3, in the first cladding region 17, the bandgap E25a of AlGaN cladding layer 25a is preferably not less than the bandgap E26a of InAlGaN cladding layer 26a. In this semiconductor light emitting device, the lattice-relaxed AlGaN cladding layer 25a can provide the large bandgap E25a that does not achieve with the quaternary InAlGaN cladding layer 26a.

In the first cladding region 17, the thickness D26a of the InAlGaN cladding layer 26a is preferably smaller than the thickness D25a of the AlGaN cladding layer 25a. This allows use of optical confinement performance that the AlGaN cladding layer provides. In addition, it is feasible to avoid reduction in throughput due to growth of thick InAlGaN.

For example, in the first cladding region 17, the thickness D26a of the InAlGaN cladding layer 26a is preferably not less than 0.05 μm. When the InAlGaN cladding layer is made too thin, the interface between the InAlGaN cladding layer and the AlGaN cladding layer (corresponding to the interface 27b in FIG. 3) cannot be located apart from the core semiconductor region 15 and this will result in an optical loss at this interface. The thickness D26a of the InAlGaN cladding layer 26a is preferably not more than 0.3 μm. Too thick InAlGaN will degrade contribution of the AlGaN cladding layer to optical confinement performance.

Structure 2 will be described. With reference to FIG. 3, in the second cladding region 19 the bandgap E35a of AlGaN cladding layer 35a is preferably not less than the bandgap E36a of InAlGaN cladding layer 36a. In this light emitting device, the lattice-relaxed AlGaN cladding layer 35a can provide the large bandgap E35a which is hard to achieve with the quaternary InAlGaN cladding layer 36a.

In the second cladding region 19, the thickness D36a of the InAlGaN cladding layer 36a is preferably smaller than the thickness D35a of the AlGaN cladding layer 35a. This allows use of optical confinement performance that the AlGaN cladding layer 35a provides. Furthermore, it is feasible to avoid reduction in throughput due to growth of thick InAlGaN.

For example, in the second cladding region 19 the thickness D36a of the InAlGaN cladding layer 36a is preferably not less than 0.05 μm. If the InAlGaN cladding layer is made too thin, the interface between the InAlGaN cladding layer and the AlGaN cladding layer (corresponding to the interface 27d in FIG. 3) cannot be located apart from the core semiconductor region 15 and this will result in an optical loss at this interface. The thickness D36a of the InAlGaN cladding layer 36a is preferably not more than 0.3 μm. Too thick InAlGaN will degrade contribution of the AlGaN cladding layer to optical confinement performance.

Figure 4:
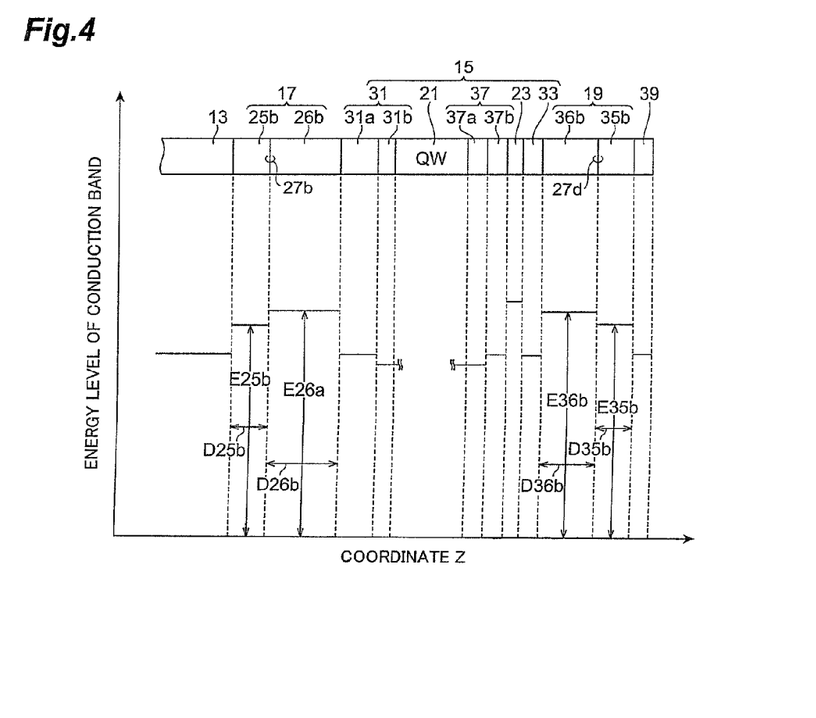
FIG. 4 is a drawing showing energy levels of conduction bands in cladding regions.

FIG. 4 is a drawing showing energy levels of conduction bands in the cladding regions. The nitride semiconductor light emitting device 11 may employ at least either one of structure 3 and structure 4 below. Structure 3 and structure 4 will be described with reference to the light emitting device having the conduction band energy levels shown in FIG. 4.

Structure 3 will be described. With reference to FIG. 4, in the first cladding region 17, the bandgap E26b of InAlGaN cladding layer 26b is preferably not less than the bandgap E25b of AlGaN cladding layer 25b. In this light emitting device, InAlGaN can be grown thick to achieve desired optical confinement performance as a whole of the cladding region 17. In the first cladding region 17 the thickness D26b of the InAlGaN cladding layer 26b is preferably larger than the thickness D25b of the AlGaN cladding layer 25b. The interface 27b between the InAlGaN cladding layer 26b and the AlGaN cladding layer 25b can be located apart from the core semiconductor region 15.

For example, in the first cladding region 17, the thickness D26b of the InAlGaN cladding layer 26b is preferably not less than 0.05 μm. If the InAlGaN layer is made too thin, the interface between the InAlGaN cladding layer and the AlGaN cladding layer cannot be located apart from the core semiconductor region and this will result in an optical loss from scattering at this interface (corresponding to the interface 27b in FIG. 4). Furthermore, the thickness D26b of the InAlGaN cladding layer 26b is preferably not more than 1.0 μm. The maximum thickness of 1.0 μm is practical even in the case of InAlGaN which does not allow a large growth rate.

Structure 4 will be described. With reference to FIG. 4, in the second cladding region 19, the bandgap E36b of InAlGaN cladding layer 36b is preferably not less than the bandgap E25b of AlGaN cladding layer 35b. In this light emitting device, thick InAlGaN can be grown in thickness to achieve desired optical confinement performance as a whole of the cladding region 19. In the second cladding region 19, the thickness D36b of the InAlGaN cladding layer 36b is preferably larger than the thickness D35b of the AlGaN cladding layer 35b. The interface 27d between the InAlGaN cladding layer 36b and the AlGaN cladding layer 35b can be located apart from the core semiconductor region 15.

For example, in the second cladding region 19, the thickness D36b of the InAlGaN cladding layer 36b is preferably not less than 0.05 μm. If the InAlGaN layer is too thin, the interface between the InAlGaN cladding layer and the AlGaN cladding layer cannot be located apart from the core semiconductor region and this will result in an optical loss from scattering at this interface (corresponding to the interface 27d in FIG. 4). The thickness D36b of the InAlGaN cladding layer 36b is preferably not more than 1.0 μm. The maximum thickness of 1.0 μm is practical even in the case of InAlGaN which does not allow a large growth rate.

Among structure 1 to structure 4 shown in FIGS. 3 and 4, a light emitting device can be constructed in a combination of structure 1 and structure 4. Another light emitting device can be constructed in a combination of structure 2 and structure 3. In these light emitting devices, technical contribution is achieved according to the combination of structures.

EXAMPLE 1

Figure 5:
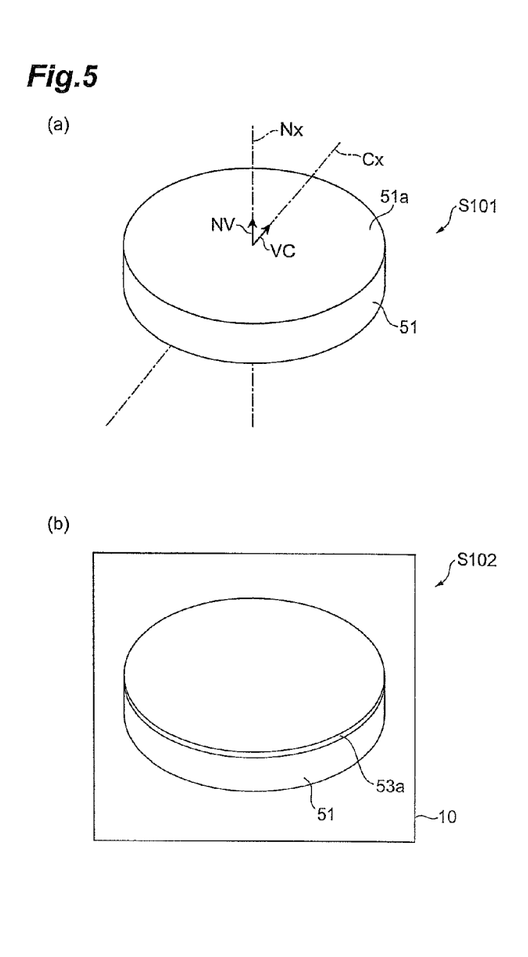
FIG. 5 is a drawing showing major steps in a method for fabricating a nitride laser diode.

A method of fabricating a nitride laser diode will be described with reference to FIGS. 5 and 6. This nitride laser diode has an LD structure shown in FIG. 7(a). Step S101 is carried out to prepare a GaN substrate 51 having a semipolar plane. A primary surface 51a of this GaN substrate 51 is inclined at 75 degrees to the m-axis direction. In the subsequent description, the laser diode (LD) structure to emit light in the 450 nm band was produced on a (20-21) plane of this semipolar GaN substrate. With reference to FIG. 5(a), a normal vector NV and a c-axis vector VC are shown along with a normal axis Nx and the c-axis Cx of the primary surface 51a. Subsequently, plural gallium nitride based semiconductor layers are grown on the GaN substrate 51 by organometallic vapor phase epitaxy to produce an epitaxial substrate. Raw materials used are as follows: trimethyl gallium (TMG), trimethyl aluminum (TMA); trimethyl indium (TMI); and ammonia ($NH_3$). Dopant gases used are as follows: silane ($SiH_4$); and bis(cyclopentadienyl) magnesium ($Cp_2Mg$).

Step S102 is carried out to place the GaN substrate 51 in a growth reactor 10. Thermal cleaning of the GaN substrate 51 is carried out using the growth reactor 10. A thermal treatment for ten minutes is carried out at the temperature of 1050 degrees Celsius under flow of gas containing $NH_3$ and $H_2$ in the growth reactor 10. In a growth step after the thermal cleaning, as shown in FIG. 5(b), raw material gases are supplied to the growth reactor 10 to grow an n-type $Al_{0.06}Ga_{0.94}N$ cladding layer (1.9 μm thick) 53a on the primary surface 51a of the GaN substrate 51, at 1100 degrees Celsius. The presence/absence of lattice relaxation on the semipolar plane can be controlled by the composition, thickness, and lattice constant difference of the grown AlGaN semiconductor and in the present example, the AlGaN semiconductor is relaxed.

Figure 6:
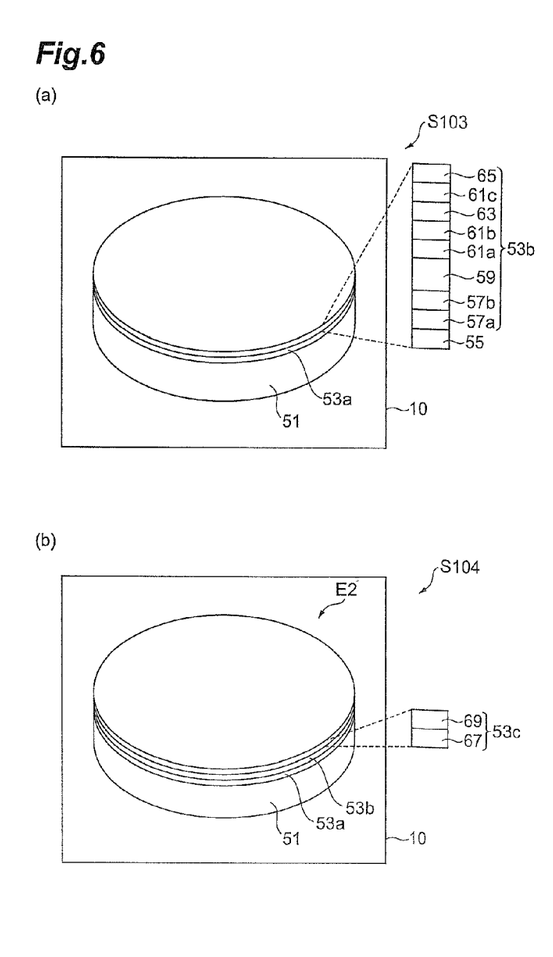
FIG. 6 is a drawing showing major steps in the method for fabricating the nitride laser diode.
Figure 7:
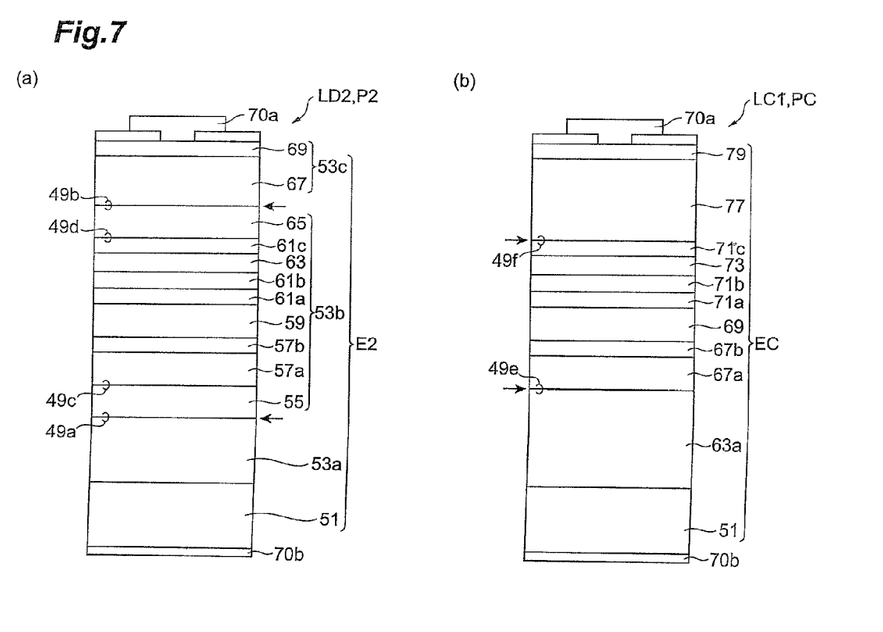
FIG. 7 is a drawing showing structures of nitride laser diodes in an example and a comparative example.

Next, as shown in FIG. 6(a), step S103 is carried out to change the growth temperature to 840 degrees Celsius and then grow an n-type $In_{0.02}Al_{0.09}Ga_{0.89}N$ cladding layer (100 nm thick) 55 on the cladding layer 53a. After this growth, the core semiconductor region is grown thereon. The growth temperature is changed to 1100 degrees Celsius and thereafter an n-type GaN optical guide layer (100 nm thick) 57a is grown on the cladding layers 53a, 55. Then an undoped $In_{0.02}Ga_{0.98}N$ optical guide layer (50 nm thick) 57b is grown thereon at the temperature of 840 degrees Celsius. An active layer 59 of a quantum well structure is grown on the optical guide layer 57b. The active layer 59 includes well layers and barrier layers which are alternately arranged and the number of well layers is three. The growth temperature of the InGaN well layers is 790 degrees Celsius and the thickness thereof is 3 nm. The growth temperature of the GaN barrier layers is 840 degrees Celsius and the thickness thereof is 15 nm. After completion of growth of the last barrier layer, an undoped $In_{0.02}Ga_{0.98}N$ optical guide layer (50 nm thick) 61a is subsequently grown thereon at the same temperature. Then, at the temperature of 1000 degrees Celsius, a p-type GaN optical guide layer (50 nm thick) 61b is grown on the optical guide layer 61a. At the same temperature, a p-type $Al_{0.12}Ga_{0.88}N$ electron block layer (20 nm thick) 63 is grown on the optical guide layer 61b. At the same temperature, a p-type GaN optical guide layer (100 nm thick) 61c is grown on the electron block layer 63. Then, the growth temperature is changed to 840 degrees Celsius and a p-type $In_{0.02}Al_{0.09}Ga_{0.89}N$ cladding layer (100 nm thick) 65 is grown thereon. A semiconductor laminate 53b is formed through these steps.

As shown in FIG. 6(b), step S104 is carried out to grow a p-type $Al_{0.06}Ga_{0.94}N$ cladding layer (400 nm thick) 67 and a p-type GaN contact layer (50 nm thick) 69 on the cladding layer 65, at the temperature of 1000 degrees Celsius in the growth reactor 10. This step results in forming a p-type semiconductor laminate 53c. The above process produces an epitaxial substrate E2.

The bandgap energy of $Al_{0.06}Ga_{0.94}N$ is 3.57 eV and the bandgap energy of $In_{0.02}Al_{0.09}Ga_{0.89}N$ is 3.54 eV. The lattice constant of $In_{0.02}Al_{0.09}Ga_{0.89}N$ is virtually lattice-matched with GaN.

Estimation of misfit dislocations is carried out with a transmission electron microscope image. In the LD structure shown in FIG. 7(a), the misfit dislocation density at a junction interface 49a between the AlGaN cladding layer 53a and the InAlGaN cladding layer 55 is $8 \times 10^4$ $cm^{-1}$. The misfit dislocation density at a junction interface 49b between the AlGaN cladding layer 67 and the InAlGaN cladding layer 65 is $8 \times 10^4$ $cm^{-1}$. There are no misfit dislocations observed at a junction interface 49c between the GaN optical guide layer 57a and the InAlGaN cladding layer 55. There are no misfit dislocations observed at a junction interface 49d between the GaN optical guide layer 61c and the InAlGaN cladding layer 65.

As a comparative example, as shown in FIG. 7(b), an LD structure is produced, and the LD structure has an n-side cladding layer consisting of an $Al_{0.06}Ga_{0.94}N$ single layer in the thickness of 2 μm and a p-side cladding layer consisting of $Al_{0.06}Ga_{0.94}N$ in the thickness of 400 nm. In this LD structure, the n-side cladding layer is made of $Al_{0.06}Ga_{0.94}N$ grown at 1100 degrees Celsius. Grown on this structure under the same growth conditions as the aforementioned core semiconductor region are an n-type GaN optical guide layer (100 nm thick) 67a, an undoped $In_{0.02}Ga_{0.98}N$ optical guide layer (50 nm thick) 67b, an active layer 69 of the quantum well structure, an undoped $In_{0.02}Ga_{0.98}N$ optical guide layer (50 nm thick) 71a, a p-type GaN optical guide layer (50 nm thick) 71b, a p-type $Al_{0.12}Ga_{0.88}N$ electron block layer (20 nm thick) 73, and a p-type GaN optical guide layer (100 nm thick) 71c. After this growth, without forming the InAlGaN cladding, a p-side cladding layer 77 and a p-type GaN contact layer (50 nm thick) 79 are grown thereon. This process produces an epitaxial substrate EC.

The epitaxial substrate EC is different in junctions where misfit dislocations are generated, from the epitaxial substrate E2. In the epitaxial substrate EC, many misfit dislocations are observed at an interface 49e between the n-side cladding layer 63a and the n-type GaN optical guide layer 67a and at an interface 49f between the p-side cladding layer 77 and the p-type optical guide layer 71c. The misfit dislocation density at the interface 49e is $8 \times 10^4$ $cm^{-1}$ and the misfit dislocation density at the interface 49f $4 \times 10^4$ $cm^{-1}$.

An electrode step is carried out to form a p-side electrode 70a of Ni/Au in a stripe window of silicon oxide film (10 μm wide) and to form a pad electrode of Ti/Au on the epitaxial substrates E2 and EC. An n-side electrode 70b of Ti/Al and a pad electrode of Ti/Au are formed on the back surface of the GaN substrate 51. These electrodes are formed by vapor deposition. Through these steps, substrate products P2, PC are fabricated from the epitaxial substrates E2 and EC. The substrate products P2, PC are cleaved at intervals of 800 μm to produce respective gain-guiding type laser diodes LD2, LC1. A dielectric multilayer film of $SiO_2/TiO_2$ is formed on cleaved facets.

Threshold currents of the laser diodes LD2, LC1 are 750 mA and 900 mA, respectively. Intensities of spontaneous emissions in the laser diodes LD2, LC1 are compared with each other and they are nearly equal to each other. Since in the laser diode LD2 the waveguide loss is reduced because of the separation of the dislocation interfaces from the waveguide region, it is considered that the laser diode LD2 of the example demonstrated the lower threshold than the laser diode LC1 of the comparative example.

EXAMPLE 2

A nitride laser diode LD3 of Example 2 has an LD structure shown in FIG. 8(a). The laser diode LD3 is different in structures of the n-side cladding and p-side cladding from the laser diode LD2. The laser diode LD3 has an n-side cladding layer of an n-type $Al_{0.04}Ga_{0.96}N$ cladding layer (1.6 μm thick) 81a and an n-type $In_{0.02}Al_{0.09}Ga_{0.89}N$ cladding layer (400 nm thick) 81b. The laser diode LD3 has a p-side cladding layer consisting of a p-type $In_{0.02}Al_{0.09}Ga_{0.89}N$ cladding layer (400 nm thick) 83. In detail, the Al composition of the n-type AlGaN cladding layer is reduced from 0.06 to 0.04 and the thickness of the n-type AlGaN cladding layer is reduced from 1.9 μm to 1.6 μm. The thickness of the n-type InAlGaN cladding layer is increased from 100 nm to 400 nm. The bandgap energy of $Al_{0.04}Ga_{0.96}N$ is 3.52 eV and the bandgap energy of $In_{0.02}Al_{0.09}Ga_{0.89}N$ is 3.54 eV.

A nitride laser diode LC2 of a comparative example has an LD structure shown in FIG. 8(b). The laser diode LC2 is different in the structure of the n-side cladding from the laser diode LD3. The laser diode LC2 has an n-side cladding layer consisting of a single n-type $In_{0.02}Al_{0.09}Ga_{0.89}N$ cladding layer (2 μm thick) 85.

Figure 8:
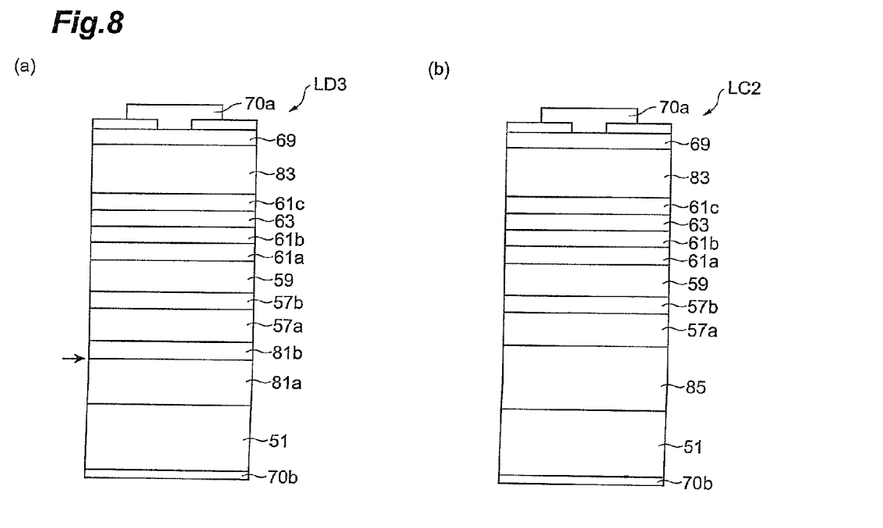
FIG. 8 is a drawing showing structures of nitride laser diodes in an example and a comparative example.

In the laser diode LD3, misfit dislocations are observed at an interface between the AlGaN layer 81a and the AlGaN layer 81b. The misfit dislocation density was $2 \times 10^4$ $cm^{-1}$. On the other hand, since the cladding layer of the laser diode LC2 is made of InAlGaN, there are no misfit dislocations observed at a junction associated with the cladding layer.

Thresholds of the laser diode LD3 and the laser diode LC2 are approximately 800 mA. Although misfit dislocations are introduced to the laser diode LD3, the threshold of the laser diode LD3 is nearly equal to the threshold of the laser diode LC2 without misfit dislocations. This shows that the misfit dislocations in the cladding region in the laser diode LD3 cause no significant effect on waveguide of light in the laser stripe.

The epitaxial growth for the epitaxial substrate in the laser diode LD3 is approximately 2.5 hours, whereas the epitaxial growth for the epitaxial substrate in the laser diode LC2 is approximately 3.7 hours. This is because the growth of InAlGaN requires a long period of time. In contrast to it, the laser diode LD3 adopts the multilayer cladding of AlGaN and InAlGaN. This shows that the laser diode LD3 can achieve an improvement in throughput, without deterioration of laser properties, by employment of the two-layer cladding.

EXAMPLE 3

Figure 9:
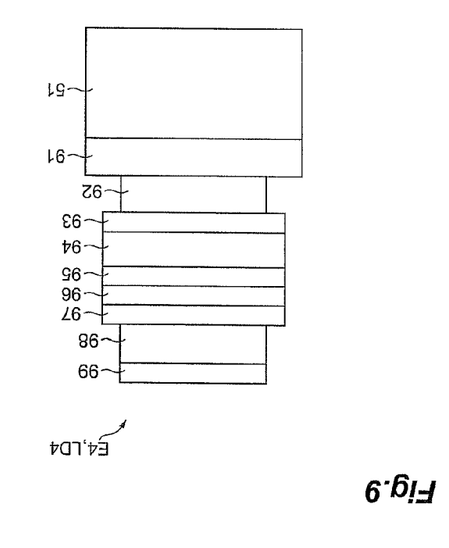
FIG. 9 is a drawing showing an epitaxial substrate for measurement of reciprocal lattice mapping.

In this example, a laser structure LD4 shown in FIG. 9 is produced. A substrate prepared is a GaN substrate 51 having a primary surface with a 75 degree off angle. The following gallium nitride based semiconductor films are grown on this GaN substrate 51: n-type GaN buffer layer 91; n-type $Al_{0.08}Ga_{0.92}N$ cladding layer (1.2 μm thick) 92; n-type GaN optical guide layer (300 nm thick) 93; InGaN/GaN active layer (well layers 3 nm thick and barrier layers 15 nm thick) 94; undoped GaN optical guide layer (50 nm thick) 95; p-type $Al_{0.11}Ga_{0.89}N$ electron block layer (10 nm thick) 96; p-type GaN optical guide layer (250 nm thick) 97; p-type $Al_{0.08}Ga_{0.92}N$ cladding layer (400 nm thick) 98; and p-type GaN contact layer (50 nm thick) 99. An epitaxial substrate E4 is produced through the growth of these layers. The lateral widths of the semiconductor layers in FIG. 9 show the relation of magnitudes of the lattice constants of the semiconductor layers.

Figure 10:
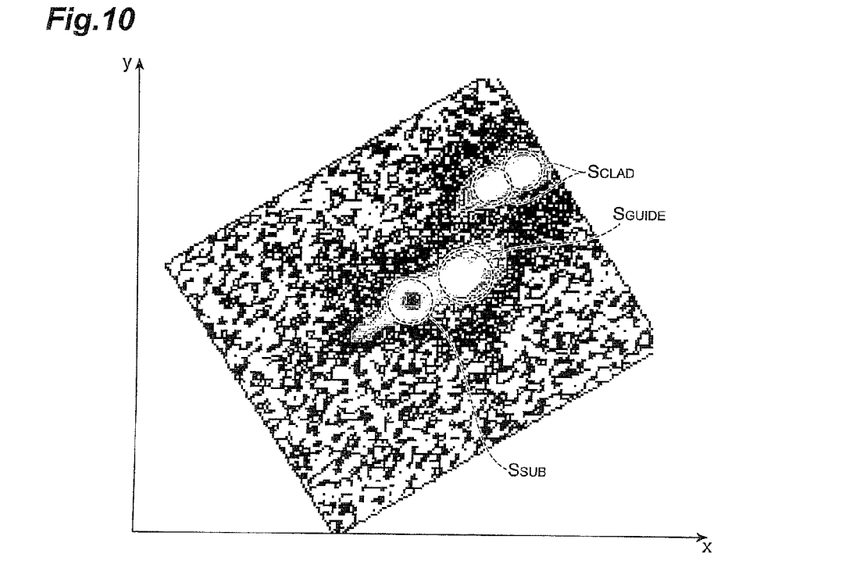
FIG. 10 is a drawing showing a reciprocal lattice mapping image of (20-24) in the epitaxial substrate.

FIG. 10 is a drawing showing reciprocal lattice mapping of (20-24) in the epitaxial substrate. A direction of incidence of X-ray is a direction parallel to the direction of inclination of the c-axis. A diffraction spot $S_{CLAD}$ of the AlGaN cladding layer is shifted from a diffraction spot $S_{SUB}$ of the GaN substrate, and the n-type AlGaN cladding layer is lattice-relaxed. A diffraction spot of the p-type AlGaN cladding layer is approximately superimposed on the diffraction spot of the n-type AlGaN cladding layer. The p-type AlGaN cladding layer is lattice-relaxed. Furthermore, a diffraction spot $S_{GUIDE}$ of the GaN optical guide layers is shifted from the diffraction spot $S_{SUB}$ of the GaN substrate. The GaN optical guide layers are lattice-relaxed. The diffraction spot $S_{GUIDE}$ of the GaN optical guide layers is shifted toward the diffraction spot $S_{SUB}$ of the GaN substrate from the diffraction spots $S_{CLAD}$ of the AlGaN claddings, the core semiconductor region having the GaN optical guide layers and the light emitting layer is relaxed on the AlGaN cladding layer, and the lattice constants of the core semiconductor region are freed from constraints of the AlGaN cladding. The reciprocal lattice mapping shown in FIG. 10 verifies the epitaxial structure of the embodiment in that the laser structure LD4 includes lattice relaxations at three locations. Namely, since the plural diffraction spots are not aligned on a straight line parallel to the y-axis, these three semiconductors are not in a lattice-matched state.

Having illustrated and described the principle of the present invention in the preferred embodiments, it should be noted that it is recognized by those skilled in the art that the present invention can be modified in arrangement and detail without departing from the principle. In the embodiments, the present invention is by no means intended to be limited to the specific configurations disclosed in the embodiments. Therefore, the applicant claims all modifications and changes falling within the scope of claims and resulting from the scope of spirit thereof.

Industrial Applicability

As described above, the embodiments are directed to the purpose to provide the nitride semiconductor light emitting device capable of improving the optical confinement performance and reducing the optical loss due to dislocations in the light emitting device formed on the nonpolar plane.

Reference Signs List
11 nitride semiconductor light emitting device;
13 . . . support substrate;
13a . . . primary surface of support substrate;
13b . . . back surface of support substrate;
15 . . . core semiconductor region;
17 . . . first cladding region;
19 . . . second cladding region;
S . . . orthogonal coordinate system;
VC . . . c-axis vector;
NV . . . normal vector; Nx normal axis;
Cx . . . c-axis;
21 . . . active layer;
23 . . . carrier block layer;
25 . . . n-type AlGaN cladding layer;
26 . . . n-type InAlGaN cladding layer;
27a to 27f . . . junctions;
35 . . . p-type AlGaN cladding layer;
36 . . . p-type InAlGaN cladding layer;
31, 33, 37 . . . gallium nitride based semiconductor layers;
39 . . . p-type contact layer;
41a . . . p-side electrode;
41b . . . n-side electrode;
43 . . . insulating film.

The invention claimed is:

1. A nitride semiconductor light emitting device comprising:
   a support substrate comprising a hexagonal gallium nitride semiconductor;
   a first cladding region comprising a first conductivity type gallium nitride-based semiconductor;
   a second cladding region comprising a second conductivity type gallium nitride-based semiconductor; and
   a core semiconductor region comprising an active layer and a carrier block layer,
   a c-axis of the hexagonal gallium nitride semiconductor being directed along a direction different from a normal axis normal to a primary surface of the support substrate, and a plane defined by the c-axis of the hexagonal gallium nitride semiconductor and the normal axis to the support substrate extending along a predetermined direction,
   the core semiconductor region being provided between the first cladding region and the second cladding region,
   the core semiconductor region, the first cladding region, and the second cladding region being mounted on the primary surface of the support substrate,
   the first cladding region including an AlGaN cladding layer and an InAlGaN cladding layer,
   the InAlGaN cladding layer of the first cladding region being provided between the active layer and the AlGaN cladding layer of the first cladding region, and
   the InAlGaN cladding layer of the first cladding region making a junction with the core semiconductor region.

2. The nitride semiconductor light emitting device according to claim 1, wherein in the first cladding region, a misfit dislocation density at an interface between the InAlGaN cladding layer and the AlGaN cladding layer is larger than a misfit dislocation density at an interface between the core semiconductor region and the first cladding region.

3. The nitride semiconductor light emitting device according to claim 2, wherein in the first cladding region, the misfit dislocation density at the interface between the InAlGaN cladding layer and the AlGaN cladding layer is not less than $1 \times 10^4 \, cm^{-1}$.

4. The nitride semiconductor light emitting device according to claim 2, wherein the misfit dislocation density at the interface between the core semiconductor region and the first cladding region is less than $1\times10^4$ cm$^{-1}$.

5. The nitride semiconductor light emitting device according to claim 1, wherein in the first cladding region, an Al composition of the AlGaN cladding layer is not less than 0.05 and not more than 0.2.

6. The nitride semiconductor light emitting device according to claim 1, wherein in the first cladding region, a thickness of the InAlGaN cladding layer is smaller than a thickness of the AlGaN cladding layer.

7. The nitride semiconductor light emitting device according to claim 1, wherein in the first cladding region, a bandgap of the InAlGaN cladding layer is not more than a bandgap of the AlGaN cladding layer.

8. The nitride semiconductor light emitting device according to claim 7, wherein in the first cladding region, a thickness of the InAlGaN cladding layer is not less than 0.05 μm and not more than 0.3 μm.

9. The nitride semiconductor light emitting device according to claim 1, wherein in the first cladding region, a bandgap of the InAlGaN cladding layer is not less than a bandgap of the AlGaN cladding layer.

10. The nitride semiconductor light emitting device according to claim 9, wherein in the first cladding region, a thickness of the InAlGaN cladding layer is not less than 0.05 μm and not more than 1.0 μm.

11. The nitride semiconductor light emitting device according to claim 1, wherein the core semiconductor region comprises a first optical guide layer,
wherein the first optical guide layer makes a junction with the InAlGaN cladding layer of the first cladding region,
wherein a lattice constant inherent to InAlGaN of the InAlGaN cladding layer of the first cladding region is not more than a lattice constant inherent to a gallium nitride-based semiconductor of the first optical guide layer of the core semiconductor region, and
wherein the lattice constant of the InAlGaN cladding layer of the first cladding region is larger than a lattice constant of the AlGaN cladding layer of the first cladding region.

12. The nitride semiconductor light emitting device according to claim 11, wherein the InAlGaN cladding layer is lattice-matched with the first optical guide layer with respect to a direction of projection of the c-axis onto the primary surface.

13. The nitride semiconductor light emitting device according to claim 1, wherein the first cladding region has n-type conductivity, and
wherein a misfit dislocation density at an interface between the AlGaN cladding layer of the first cladding region and the support substrate is larger than a misfit dislocation density at an interface between the core semiconductor region and the first cladding region.

14. The nitride semiconductor light emitting device according to claim 1, wherein the first cladding region has p-type conductivity,
the nitride semiconductor light emitting device further comprising a p-type contact layer provided on the first cladding region,
wherein the core semiconductor region comprises a second optical guide layer and an electron block layer,
wherein the second optical guide layer is provided between the electron block layer and the first cladding region, and
wherein the electron block layer is provided between the second optical guide layer and the active layer.

15. The nitride semiconductor light emitting device according to claim 1, wherein the first cladding region has n-type conductivity,
wherein the second cladding region has p-type conductivity,
wherein the second cladding region comprises an AlGaN cladding layer and an InAlGaN cladding layer,
wherein the InAlGaN cladding layer of the second cladding region is provided between the active layer and the AlGaN cladding layer of the second cladding region,
wherein the InAlGaN cladding layer of the second cladding region makes a junction with the core semiconductor region, and
wherein a lattice constant of the InAlGaN cladding layer of the second cladding region is larger than a lattice constant of the AlGaN cladding layer of the second cladding region.

16. The nitride semiconductor light emitting device according to claim 15, wherein a misfit dislocation density at an interface between the AlGaN cladding layer and the InAlGaN cladding layer of the second cladding region is larger than a misfit dislocation density at an interface between the core semiconductor region and the second cladding region.

17. The nitride semiconductor light emitting device according to claim 15, wherein a misfit dislocation density at an interface between the AlGaN cladding layer and the InAlGaN cladding layer of the second cladding region is not less than $1\times10^4$ cm$^{-1}$.

18. The nitride semiconductor light emitting device according to claim 1, wherein an angle between the c-axis of the hexagonal gallium nitride semiconductor and the normal axis to the support substrate is not less than 10 degrees and not more than 170 degrees.

19. The nitride semiconductor light emitting device according to claim 1, wherein the angle is in a range of not less than 10 degrees and not more than 80 degrees or in a range of not less than 100 degrees and not more than 170 degrees.

20. The nitride semiconductor light emitting device according to claim 1, wherein the angle is in a range of not less than 63 degrees and not more than 80 degrees or in the range of not less than 100 degrees and not more than 117 degrees.

* * * * *